(12) United States Patent
Kim

(10) Patent No.: US 7,298,157 B2
(45) Date of Patent: Nov. 20, 2007

(54) DEVICE FOR GENERATING INTERNAL VOLTAGES IN BURN-IN TEST MODE

(75) Inventor: Yong Mi Kim, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/828,082

(22) Filed: Apr. 20, 2004

(65) Prior Publication Data
US 2005/0111289 A1    May 26, 2005

(30) Foreign Application Priority Data
Nov. 26, 2003    (KR) ............. 10-2003-0084308

(51) Int. Cl.
*G01R 31/26* (2006.01)
(52) U.S. Cl. ............ 324/765; 365/189.11; 365/185.23
(58) Field of Classification Search ................ None
See application file for complete search history.

(56) References Cited

U.S. PATENT DOCUMENTS

| | | | |
|---|---|---|---|
| 3,627,682 A * | 12/1971 | Hall et al. ............... 430/106.2 |
| 5,294,776 A * | 3/1994 | Furuyama .................. 219/209 |
| 5,317,532 A * | 5/1994 | Ochii ........................ 365/149 |
| 5,442,282 A * | 8/1995 | Rostoker et al. ......... 324/158.1 |
| 5,648,661 A * | 7/1997 | Rostoker et al. ............... 257/48 |
| 5,673,229 A * | 9/1997 | Okamura et al. ........... 365/201 |
| 5,798,653 A * | 8/1998 | Leung, Jr. .................... 324/760 |
| 5,953,271 A * | 9/1999 | Ooishi ........................ 365/201 |
| 6,119,255 A * | 9/2000 | Akram ....................... 714/724 |
| 6,255,837 B1 * | 7/2001 | Habersetzer et al. ........ 324/763 |
| 6,327,682 B1 * | 12/2001 | Chien et al. ................. 714/718 |
| 6,532,174 B2 * | 3/2003 | Homma et al. .......... 365/185.2 |
| 6,577,538 B2 * | 6/2003 | Atsumi et al. ......... 365/185.27 |
| 6,707,737 B2 * | 3/2004 | Tanizaki ..................... 365/201 |
| 6,785,629 B2 * | 8/2004 | Rickes et al. ................ 702/118 |
| 6,909,642 B2 * | 6/2005 | Lehmann et al. ...... 365/189.09 |
| 6,909,648 B2 * | 6/2005 | Terzioglu et al. ........... 365/201 |

FOREIGN PATENT DOCUMENTS

| | | |
|---|---|---|
| KR | 10-1999 0046939 | 7/1999 |
| KR | 20-2000 0006766 | 4/2000 |

* cited by examiner

*Primary Examiner*—Vinh Nguyen
*Assistant Examiner*—Richard Isla-Rodas
(74) *Attorney, Agent, or Firm*—Ladas & Parry LLP

(57) ABSTRACT

The disclosure is a device for applying a test voltage from the external of a memory device in a burn-in test mode. An internal voltage generator for a burn-in test is comprised of pad means receiving an external voltage, switching means turned on in the burn-in test mode, and an internal voltage generating means. An external voltage applied to the pad means during the burn-in test mode is transferred to the internal voltage generating means by way of the switching means.

8 Claims, 2 Drawing Sheets

DEVICE FOR GENERATING INTERNAL VOLTAGES IN BURN-IN TEST MODE

BACKGROUND OF THE INVENTION

1. Field of the Invention

The present invention relates to a device for applying a test voltage from the external of a memory device in a burn-in test mode.

2. Description of the Related Art

It is well known in general that the burn-in test is carried out to test a semiconductor device in the extreme environment of high temperature and high pressure, which verifies the reliability of the semiconductor device.

FIG. 1 illustrates a conventional burn-in test scheme.

In FIG. 1, a test mode unit 100 is a circuit to output a burn-in test signal tm_bi in a test mode. A high voltage generator 101 is a circuit to generate a high voltage VPP applied to wordlines of a memory device. A wordline driver 102 applies the high voltage VPP to a wordline. A reference voltage generator 103 for core voltage generates a reference voltage VREFC. A core voltage generator 104 outputs a core voltage. Here, the core voltage means a voltage used in a bank region of a memory device. And, a block 11 depicts a high voltage transfer route, while a block 12 depicts a core voltage transfer route. In reference, the core voltage is a high-level voltage stored in a memory cell and the reference voltage VREFC is a half level (½) of the core voltage. The core voltage Vcore provided from the core voltage generator 104 is used as a driving voltage of a bitline sense amplifier 105. The core voltage Vcore is transferred to bitlines Bit and /Bit by the bitline sense amplifier 105.

In a conventional case as shown in FIG. 1, a burn-in test is carried out with the high voltage and the core voltage which are made within a memory device. In other word, after the burn-in test signal tm_bi as a control signal generated from the test mode unit 100 enables the high voltage generator 101 and the reference voltage generator 103, the high voltage and the core voltage (i.e., a burn-in test voltage) are applied to the wordline and bitline.

With such a scheme using the internal burn-in test voltages for a burn-in test mode, there are several disadvantages as follows:

1) It is difficult to generate accurate voltage levels of the burn-in test voltages (voltage levels of the high voltage and the core voltage);

2) It would occur shortness of the burn-in test voltage levels under required voltage levels because of process variations, which degrades the screen ability thereof; and 3) It would result in an overkill effect when the internal burn-in test voltages are very higher than the required voltage levels.

SUMMARY OF THE INVENTION

Accordingly, the present invention has been made in an effort to solve the problems occurring in the related art, and an object of the present invention is to provide an internal voltage generator capable of performing a reliable burn-in test operation by applying a test voltage from the external of a memory device during a burn-in test mode.

In order to achieve the above object, according to one aspect of the present invention, there is provided an internal voltage generator for a burn-in test comprising pad means for receiving an external voltage; switch means being turned on in a burn-in test mode; and receiving means for receiving the external voltage. The external voltage applied to the pad means is transferred to the receiving means through the switch means.

A test mode unit is further comprised for controlling an operation of the switch means.

In the embodiment of the present invention, the receiving means comprises a wordline driver used in a memory device, and a reference voltage generator for core voltage. The external voltage includes first and second voltages. The pad means includes first and second pads. The switch means includes first and second switches. The first voltage is applied to the high voltage generator through the first pad. The second voltage is applied to the reference voltage generator for core voltage through the second pad.

According to another aspect of the present invention, an internal voltage generator for a burn-in test applies an external voltage to a memory device through pad means of the memory device and then generates an internal voltage for the burn-in test.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

Figure 1:
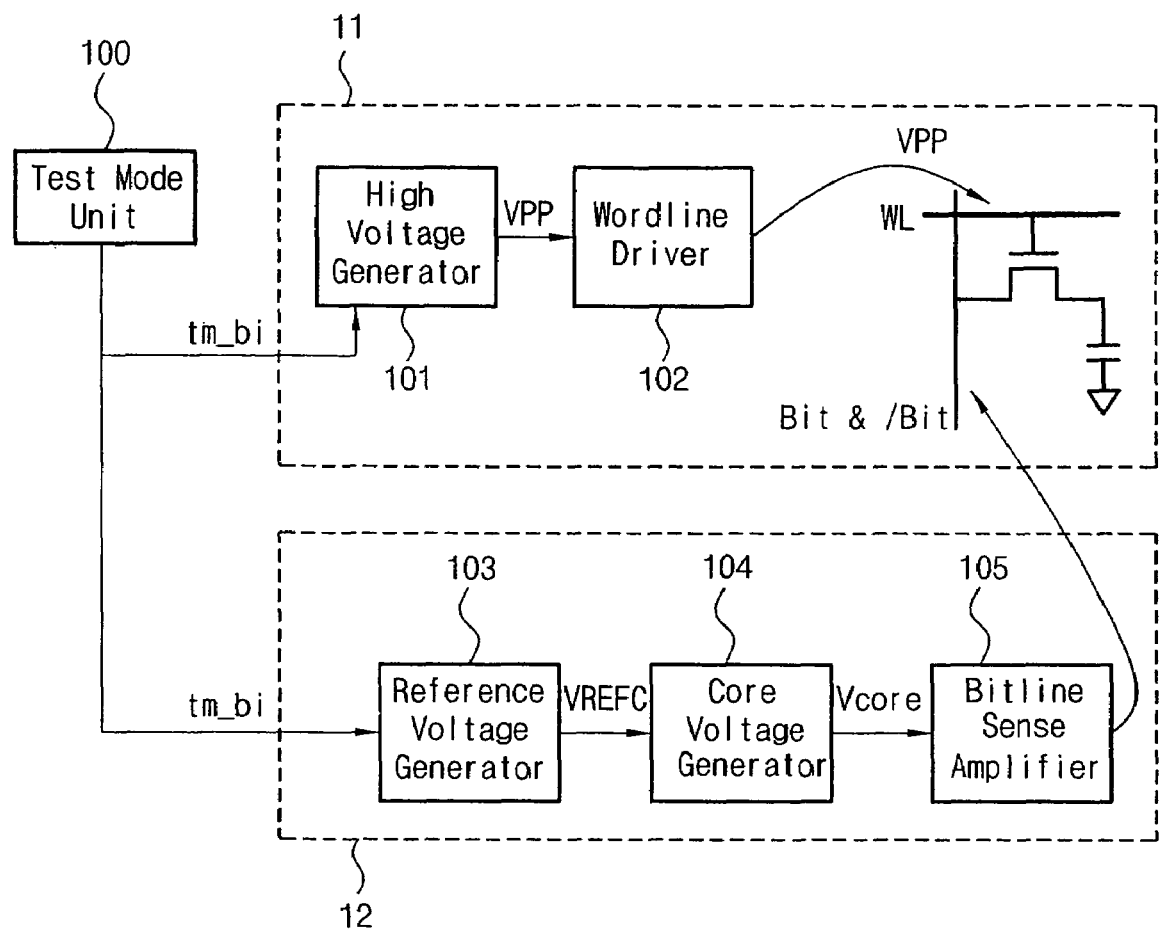
FIG. 1 is a block diagram illustrating a convention burn-in test method.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 2:
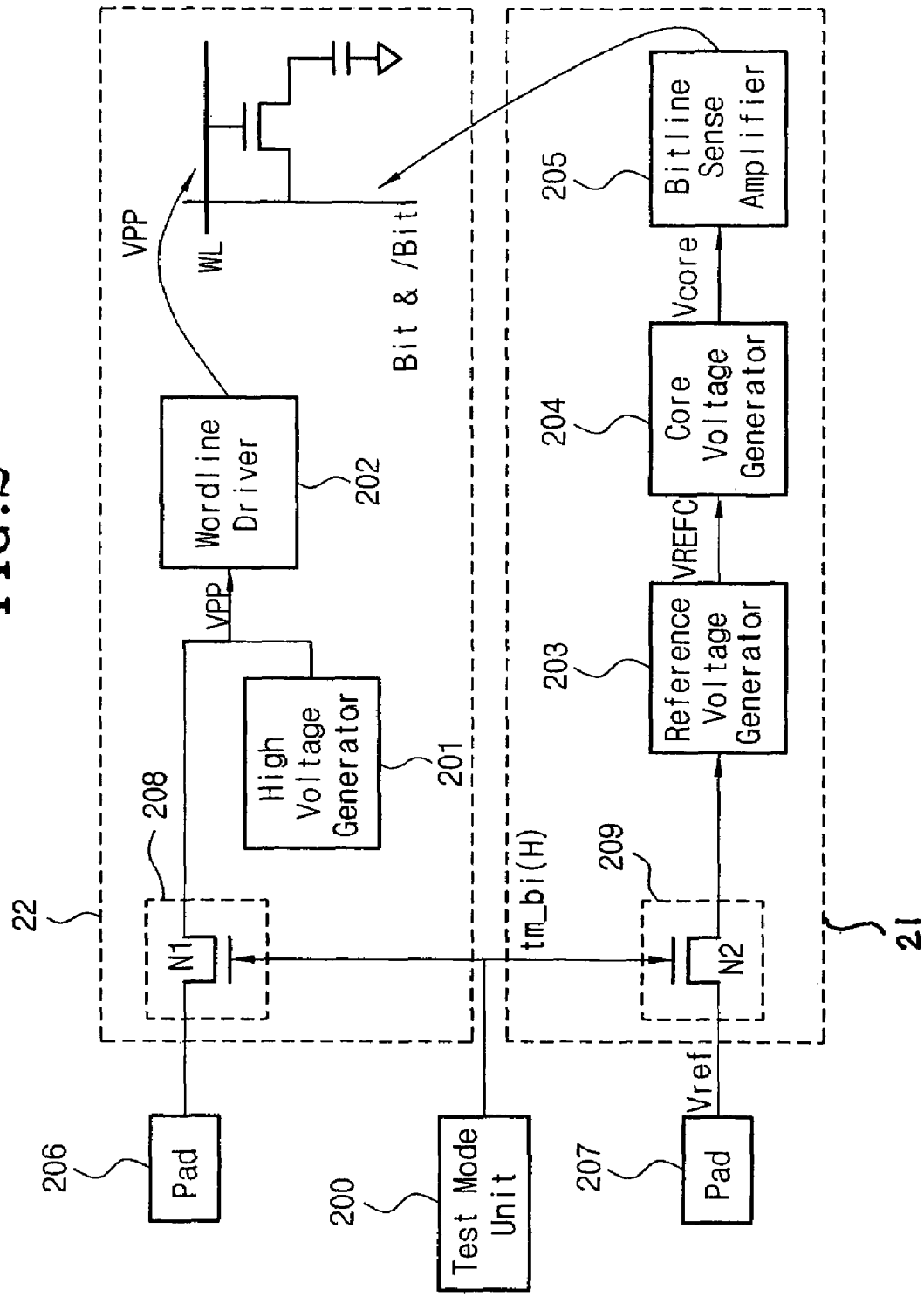
FIG. 2 is a diagram illustrating a way of applying a test voltage directly from the external, according to the present invention.

FIG. 2 illustrates an internal voltage generator for a burn-in test mode according to an embodiment of the present invention.

Referring to FIG. 2, a test mode unit 200 is a circuit to output a burn-in test signal tm_bi in a test mode. A high voltage generator 201 is a circuit to generate a high voltage VPP applied to wordlines of a memory device. A wordline driver 202 applies the high voltage VPP to a wordline. A reference voltage generator 203 for core voltage generates a reference voltage VREFC. A core voltage generator 204 outputs a core voltage. The core voltage Vcore provided from the core voltage generator 204 is used as a driving voltage of a bitline sense amplifier 205. The core voltage Vcore is transferred to bitlines Bit and /Bit by the bitline sense amplifier 205. In reference, a block 22 depicts a high voltage transfer route, while a block 21 depicts a core voltage transfer route.

In a normal operation mode, but not in a burn in test mode, the test mode unit 200 outputs a test signal of low level to maintain the switches 208 and 209 in a turn-off state. Therefore, if a current operation mode is not the burn-in test mode, the block 22 of high voltage transfer route and the block 21 of core voltage transfer route perform their normal operations. In other words, the high voltage generator 210 and the core voltage generator 204 carry out their normal operations.

In the burn-in test mode, the switches 208 and 209 are turned on by the burn-in test signal tm_bi generated from the test mode unit 200. Here, the switches 208 and 209 include NMOS transistors, PMOS transistors, and transmission gates. FIG. 2 shows the switches as structured of NMOS transistors.

A first external voltage is applied to a pad 206 connected to the switch 208. The first external voltage is a high voltage for the burn-in test and the pad 206 may be assigned to a CKE pad (e.g., for a clock enable signal) of a memory device. The first external voltage is transferred to a wordline driver 202 through the pad 206 and the switch 208. During the burn-in test mode, the high voltage generator 201 is maintained in a disable state. Thus, the wordline driver 202 applies the first external voltage directly to a wordline. As a result, a stress voltage by the first external voltage is applied to a gate oxide of a cell transistor coupled to the wordline.

Next, a second external voltage (a reference voltage) is applied to a pad 207 connected to the switch 209. The second external voltage is a reference voltage for the burn-in test and the pad 207 may be assigned to a Vref pad. The second external voltage is applied to the reference voltage generator 203 for the core voltage by way of the switch 209 and then the reference voltage VREFC of a predetermined voltage level is generated from the reference generator 203. It is desirable for the reference voltage VREFC to have the same voltage level of the second external voltage. The reference voltage VREFC generated from the reference generator 203 for core voltage is applied to the core voltage generator 204. The core voltage generator 204 outputs the core voltage VCORE that is used as a driving voltage for the bitline sense amplifier 205. The core voltage VCORE is transferred to a bitline by the bitline sense amplifier 205. As a result, the core voltage VCORE is supplied to a cell capacitor as a stress voltage.

As apparent from the above description, the present invention provides a more accurate burn-in test operation by applying a burn-in test voltage, to be used in a semiconductor device, through an external pad during a burn-in test mode.

According further to the aforementioned, the present invention is able to apply an external voltage into a semiconductor device through an external pad during a burn-in test mode, and obtains the merits as follows:

1) It is possible to generate accurate voltage levels of the burn-in test voltages (voltage levels of the high voltage and the core voltage);

2) It reduces fluctuation of the burn-in test voltage levels due to process variations; and 3) It lightens an overkill effect to increase a product yield because a test voltage with a required voltage level can be applied thereto.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An internal voltage generator for a burn-in test in a semiconductor memory device, comprising:
   at least two transistor switches each of which receiving an external voltage,
      wherein a first transistor switch receives a first external voltage and a second transistor switch receives a second external voltage, and
      wherein the first and second transistor switches are in a first predetermined state of either on or off during a burn-in test mode; and
   a word line driver connected to the first transistor switch and receiving a word line driving voltage, wherein the word line driver outputs the word line driving voltage to a word line, and when the first and second transistor switches are in the first predetermined state during a burn-in test mode the first external voltage is outputted to the word line to carry out a burn in test;
   a bit line driver connected to the second transistor switch and generating a bit line driving voltage, wherein the bit line driver outputs the bit line driving voltage to a bit line, and when the first and second transistor switches are in the first predetermined state during a burn-in test mode the bit line driver outputs a bit line driving voltage generated based on the second external voltage to the bit line to carry out the burn in test.

2. The internal voltage generator of claim 1, further comprising a test mode unit providing a burn-in test control signal to the first and second transistor switches during a burn-in test such that the first and second transistor switches remain in the first predetermined state in presence of the burn-in test control signal.

3. The internal voltage generator of claim 1, wherein either the first transistor switch or the second transistor switch is one of an NMOS transistor, a PMOS transistor, and a transmission gate.

4. The internal voltage generator of claim 1, further comprising a high voltage generator connected to the wordline driver, wherein the high voltage generator outputs the word line driving voltage to the word line driver.

5. An internal voltage generator for a burn-in test in a semiconductor memory device, comprising:
   at least two switches each of which receiving an external voltage,
      wherein a first switch receives a first external voltage and a second switch receives a second external voltage, and
      wherein the first and second switches are in a first predetermined state of either on or off during a burn-in test mode; and
   a word line driver connected to the first switch and receiving a word line driving voltage, wherein the word line driver outputs the word line driving voltage to a word line, and when the first and second switches are in the first predetermined state during a burn-in test mode, the first external voltage is outputted to the word line to carry out a burn in test;
   a bit line driver connected to the second switch and generating a bit line driving voltage, the bit line driver comprising:
      a reference voltage generator connected to the second switch;
      a core voltage generator connected to the reference voltage generator; and
      a bit sense amplifier connected to the core voltage generator and a bit line, wherein the bit line driver outputs the bit line driving voltage to the bit line, and when the first and second switches are in the first predetermined state during a burn-in test mode, the bit line driver outputs a bit line driving voltage generated based on the second external voltage to the bit line to carry out the burn in test.

6. The internal voltage generator of claim 5,
   wherein, when in the first predetermined state, the second external voltage is inputted to the reference voltage generator that outputs a reference voltage having substantially same voltage level as the reference voltage to the core voltage generator that outputs a core voltage to the bit line sense amplifier that then outputs the stress voltage to the bit line, and wherein when not in the first predetermined state, the reference voltage generator outputs a reference voltage to the core voltage generator the core voltage generator outputs a core voltage to the bit sense amplifier; and the bit sense amplifier outputs the bit line driving voltage to the bit line.

7. The internal voltage generator of claim 6 wherein a pad is connected to each of the plurality of the switches; and wherein an external voltage having a predetermined level is inputted to each pad.

8. An internal voltage generator for a burn-in test in a semiconductor memory device, comprising:

a first pad;

a second pad;

a word line driver for supplying a driving voltage to a word line;

a bit line driver for driving a bit line, the bit line driver comprising:

a reference voltage generator connected to a switch;

a core voltage generator connected to the reference voltage generator; and a bit sense amplifier connected to the core voltage generator; and a bit line, wherein the bit line driver outputs the bit line driving voltage to the bit line, and when the first and second switches are in the first predetemiined state during a bum-in test mode, the bit line driver outputs a bit line driving voltage generated based on the second external voltage to the bit line to carry out the burn in test.

* * * * *